United States Patent
Yu et al.

(10) Patent No.: US 9,761,829 B2
(45) Date of Patent: Sep. 12, 2017

(54) ORGANIC ELECTROLUMINESCENT DEVICE HAVING A SEALANT WITH MAGNETIC PARTICLES, METHOD FOR PREPARING THE SAME AND DISPLAY PANEL

(71) Applicant: Boe Technology Group Co., Ltd., Beijing (CN)

(72) Inventors: Donghui Yu, Beijing (CN); Chun Jan Wang, Beijing (CM); Huaiting Shih, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/214,297

(22) Filed: Jul. 19, 2016

(65) Prior Publication Data
US 2017/0110682 A1  Apr. 20, 2017

(30) Foreign Application Priority Data
Oct. 14, 2015  (CN) .......................... 2015 1 0662267

(51) Int. Cl.
| | | |
|---|---|---|
| H01J 1/62 | (2006.01) | |
| H01J 9/26 | (2006.01) | |
| H01L 51/52 | (2006.01) | |
| H01L 51/56 | (2006.01) | |

(52) U.S. Cl.
CPC ...... *H01L 51/5246* (2013.01); *H01L 51/5203* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 2004/0191566 A1* | 9/2004 | Kikuchi | H01L 51/529 428/690 |
| 2009/0009046 A1* | 1/2009 | Oh | H01L 51/5246 313/1 |
| 2011/0248625 A1 | 10/2011 | Kwon et al. | |

FOREIGN PATENT DOCUMENTS

CN  101635296  1/2010

OTHER PUBLICATIONS

Chinese Office Action with English Language Translation, dated Mar. 23, 2016, Chinese Application No. 201510662267.1.

* cited by examiner

*Primary Examiner* — Tracie Y Green
(74) *Attorney, Agent, or Firm* — Blakely Sokoloff Taylor & Zafman LLP

(57) ABSTRACT

An organic electroluminescent device, a method for preparing an organic electroluminescent device, and a display panel are disclosed. The organic electroluminescent device comprises a conductive layer formed by transparent magnetic conductive particles which are mixed in the sealing layer and stacked on a surface of the first transparent electrode layer. The conductive layer increases the conductive performance while not increasing the thickness of the first transparent electrode layer, thereby avoiding decrease of the light transmittance caused by increase of the thickness of the first transparent electrode layer, and avoiding the problem of voltage drop due to poor conductivity of the first transparent electrode layer, so as to improve the display effect and use stability of the organic electroluminescent device.

20 Claims, 4 Drawing Sheets

ORGANIC ELECTROLUMINESCENT DEVICE HAVING A SEALANT WITH MAGNETIC PARTICLES, METHOD FOR PREPARING THE SAME AND DISPLAY PANEL

RELATED APPLICATIONS

The present application claims the benefit of Chinese Patent Application No. 201510662267.1, filed Oct. 14, 2015, the entire disclosure of which is incorporated herein by reference.

TECHNICAL FIELD

The present invention relates to the field of display technology, particularly to an organic electroluminescent device, a method for preparing an organic electroluminescent device, and a display panel.

BACKGROUND

The organic electroluminescent device (OLED) itself has the advantages of low power consumption, self-luminous, wide visual angle, low cost, wide temperature range, high response speed, continuous adjustable luminous color, flexible display, and simple process etc., and the organic electroluminescent device display panel has been widely applied in electronic products such as mobile phones.

The organic electroluminescent device can be classified into a top emitting devices and a bottom emitting device according to the direction of emission of light from the device, in the top emitting device, the light is emitted from the top of the organic electroluminescent device, and does not pass through the driving panel at the bottom, hence, it has a higher aperture ratio, which is benefit for realizing display of high brightness and high resolution.

The top emitting device generally uses indium zinc oxide (IZO) as the electrode layer, and generally uses the method of increasing the thickness of the electrode layer or realizing lapping to enhance the conductivity of the electrode layer. However, with the increase of the thickness of the electrode layer, it may result in decrease of the light transmittance of the organic electroluminescent device, thereby reducing the display effect of the organic electroluminescent device.

SUMMARY

The present invention provides an organic electroluminescent device, a method for preparing an organic electroluminescent device, and a display panel, which enhances the conductivity thereof on the premise of not increasing the thickness of the electrode layer, avoid the problem of decrease of light transmittance caused by increase of the thickness of the electrode layer, and avoid the problem of voltage drop due to poor conductivity of the first transparent electrode layer, thereby improving display effect and use stability of the organic electroluminescent device.

In an embodiment, an organic electroluminescent device comprises a substrate and a cover plate arranged opposite to each other, a sealing frame located between the substrate and the cover plate for connecting the substrate and the cover plate, a sealing layer filling an area enclosed by the sealing frame and bonded with the substrate and the cover plate, a first transparent electrode layer being provided at a side of the substrate facing the cover plate. The organic electroluminescent device further comprises a conductive layer formed by transparent magnetic conductive particles which are mixed in the sealing layer and stacked on a surface of the first transparent electrode layer.

In the organic electroluminescent device, because a conductive layer formed by stack of transparent magnetic conductive particles is formed on the first transparent electrode layer, the conductive layer improves the conductive performance of the first transparent electrode layer. The organic electroluminescent device reduces the thickness of the first transparent electrode layer while ensuring the conductive performance of the first transparent electrode layer, thereby increasing the light transmittance of the organic electroluminescent device, and avoiding the problem of voltage drop due to poor conductivity of the first transparent electrode layer. Therefore, the organic electroluminescent device has higher light transmittance and use stability.

In an embodiment, the first transparent electrode layer comprises indium zinc oxide.

In an embodiment, a weight concentration of the transparent magnetic conductive particles in the sealing layer is greater than or equal to 5% and less than or equal to 50%.

In an embodiment, a diameter of the transparent magnetic conductive particles in the sealing layer is not greater than 200 nm.

In an embodiment, the transparent magnetic conductive particles are metal oxide nanoparticles or non-metal oxide nanoparticles.

In an embodiment, a second transparent electrode layer is formed on a surface of the cover plate facing the substrate, the sealing layer is provided with a conductor structure formed by transparent magnetic conductive particles mixed in the sealing layer, and the conductor structure joins the second transparent electrode layer with the first transparent electrode layer.

The present invention further provides in an embodiment an organic electroluminescent device display panel, comprising the organic electroluminescent device as stated above.

The present invention further provides in an embodiment a method for preparing the organic electroluminescent device as stated above, comprising:

step S101, coating a sealing frame and a sealing material mixed with transparent magnetic conductive particles between a cover plate and a substrate, and adjusting distribution of transparent magnetic conductive particles within the sealing material through magnetic field effect, to form a conductive layer on a surface of a first transparent electrode layer, wherein the first transparent electrode layer is formed at a side of the substrate facing the cover plate, and the conductive layer is formed by transparent magnetic conductive particles stacked on the surface of the first transparent electrode layer; and step S102, curing the sealing frame and the sealing material to assemble the substrate and the cover plate.

In the method, because the transparent magnetic conductive particles within the sealing material, under the effect of magnetic field, are stacked on the first transparent electrode layer and form a conductive layer, the conductive layer improves the conductive performance of the first transparent electrode layer. The method reduces the thickness of the first transparent electrode layer while ensuring the conductive performance of the first transparent electrode layer, thereby increasing the light transmittance of the organic electroluminescent device, and avoiding the problem of voltage drop due to poor conductivity of the first transparent electrode layer. Therefore, the method increases the display effect and use stability of the organic electroluminescent device.

In an embodiment, the step S101 comprises:

coating the sealing frame on the cover plate;

coating the sealing material mixed with transparent magnetic conductive particles within an area enclosed by the sealing frame on the cover plate;

pressing the cover plate and the substrate formed with the first transparent electrode layer together in vacuum; and placing the pressed cover plate and substrate in a magnetic field, adjusting distribution of transparent magnetic conductive particles within the sealing material through magnetic field effect, to form the conductive layer on the surface of the first transparent electrode layer, wherein the first transparent electrode layer is formed at a side of the substrate facing the cover plate, and the conductive layer is formed by transparent magnetic conductive particles stacked on the surface of the first transparent electrode layer.

In an embodiment, the sealing material is coated on the cover plate using gluing process, slot coating or ink jet coating.

In an embodiment, the step S101 comprises:

coating the sealing material mixed with transparent magnetic conductive particles on the first transparent electrode layer on the substrate;

placing the substrate in a magnetic field, adjusting distribution of transparent magnetic conductive particles within the sealing material through magnetic field effect, to form a conductive layer on a surface of a first transparent electrode layer, wherein the first transparent electrode layer is formed at a side of the substrate facing the cover plate, and the conductive layer is formed by transparent magnetic conductive particles stacked on the surface of the first transparent electrode layer; and pressing the substrate and the cover plate coated with the sealing frame together in vacuum.

In an embodiment, the sealing material is coated on the substrate using ink jet coating or slot coating.

In an embodiment, the step S102 comprises:

curing the sealing frame and the sealing material by UV radiation or heating to assemble the substrate and the cover plate.

In an embodiment, prior to the step S101, the method further comprises:

mixing transparent magnetic conductive particles in the sealing material.

DETAILED DESCRIPTION OF EMBODIMENTS

Next, the technical solutions in embodiments of the present invention will be described clearly and completely with reference to the drawings in the embodiments of the present invention. Apparently, the embodiments described are only a part of rather than all of the embodiments of the present invention. Based on the embodiments in the present invention, all other embodiments obtained by the ordinary skilled person in the art on the premise of not paying any creative work belong to the protection scope of the present invention.

Reference signs: 10-substrate; 11-first transparent electrode layer; 20-cover plate; 21-second transparent electrode layer; 30-sealing frame; 40-sealing layer; 50-conductive layer; 51-transparent magnetic conductive particle; 52-conductor structure.

Figure 1:
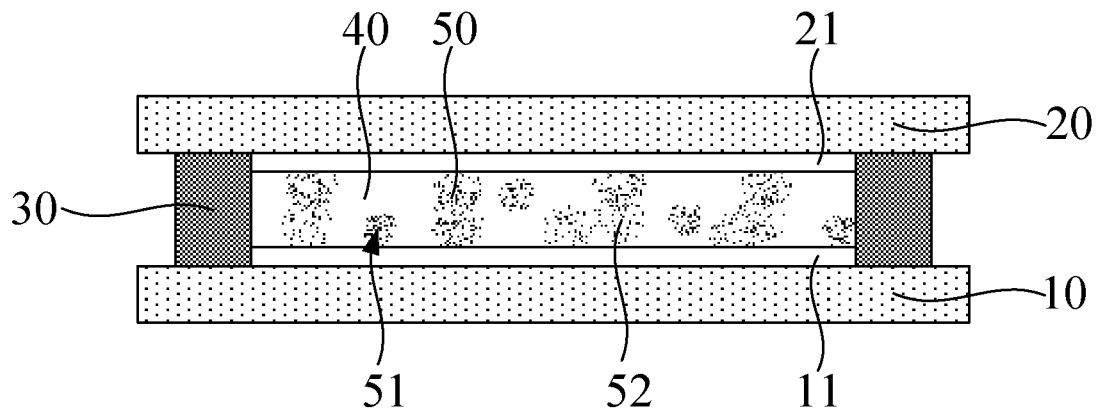
FIG. 1 is a structural schematic view of an organic electroluminescent device provided by an embodiment of the present invention.

As shown in FIG. 1, an embodiment of the present invention provides an organic electroluminescent device, comprising a substrate 10 and a cover plate 20 arranged opposite to each other, a sealing frame 30 located between the substrate 10 and the cover plate 20 for connecting the substrate 10 and the cover plate 20, a sealing layer 40 filling an area enclosed by the sealing frame 30 and bonded with the substrate 10 and the cover plate 20, a side of the substrate 10 facing the cover plate 20 being provided with a first transparent electrode layer 11, further comprising a conductive layer 50 formed by stack of transparent magnetic conductive particles 51 mixed in the sealing layer 40 on a surface of the first transparent electrode layer 11.

In the organic electroluminescent device, because a conductive layer 50 formed by stack of transparent magnetic conductive particles 51 is formed on the first transparent electrode layer 11, the conductive layer 50 improves the conductive performance of the first transparent electrode layer 11. The organic electroluminescent device reduces the thickness of the first transparent electrode layer 11 while ensuring the conductive performance of the first transparent electrode layer 11, thereby increasing the light transmittance of the organic electroluminescent device, and avoiding the problem of voltage drop due to poor conductivity of the first transparent electrode layer 11. Therefore, the organic electroluminescent device has higher light transmittance and use stability.

In an example, the first transparent electrode layer comprises indium zinc oxide.

In an example, in order to ensure the conductive performance of the sealing layer, a weight concentration of the transparent magnetic conductive particles in the sealing layer is greater than or equal to 5% and less than or equal to 50%.

In an embodiment, a diameter of the transparent magnetic conductive particles in the sealing layer is not greater than 200 nm.

In an example, the transparent magnetic conductive particles are metal oxide nanoparticles or non-metal oxide nanoparticles.

In the example as shown in FIG. 1, a second transparent electrode layer 21 is formed on a surface of the cover plate 20 facing the substrate 10, the sealing layer 40 is provided with a conductor structure 52 formed by transparent magnetic conductive particles 51 mixed in the sealing layer, so as to lap the second transparent electrode layer 21 formed on the cover plate 20 with the first transparent electrode layer 11.

Because the first transparent electrode layer 11 and the second transparent electrode layer 21 are lapped through the conductor structure 52 formed by transparent magnetic conductive particles 51, and the conductor structure 52 is a transparent structure, compared with the manner of realizing lapping using a metal conductive layer formed on a spacer in the prior art, the manner increases the light transmittance of the organic electroluminescent device.

An embodiment of the present invention further provides an organic electroluminescent device display panel, comprising the above organic electroluminescent device.

Figure 2:
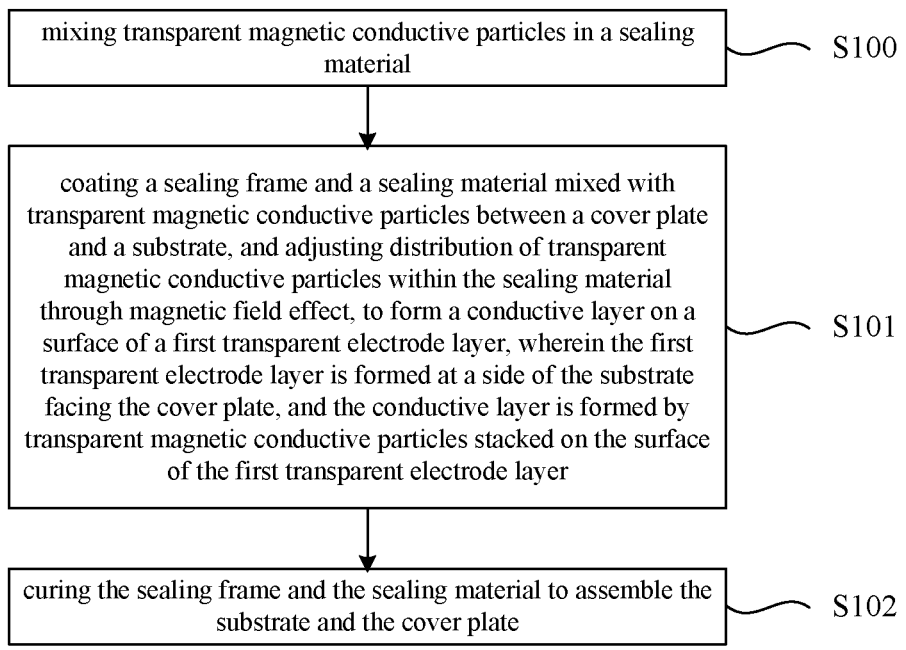
FIG. 2 is a flow chart of a method for preparing an organic electroluminescent device provided by an embodiment of the present invention.

As shown in FIG. 2, the present invention further provides a method for preparing the above organic electroluminescent device, comprising:

step S101, coating a sealing frame and a sealing material mixed with transparent magnetic conductive particles between a cover plate and a substrate, and adjusting distribution of transparent magnetic conductive particles within the sealing material through magnetic field effect, to form a conductive layer on a surface of a first transparent electrode layer, wherein the first transparent electrode layer is formed at a side of the substrate facing the cover plate, and the conductive layer is formed by transparent magnetic conductive particles stacked on the surface of the first transparent electrode layer; and step S102, curing the sealing frame and the sealing material to assemble the substrate and the cover plate.

In the method, because the transparent magnetic conductive particles within the sealing material, under the effect of magnetic field, are stacked on the first transparent electrode layer and form a conductive layer, the conductive layer improves the conductive performance of the first transparent electrode layer. The method reduces the thickness of the first transparent electrode layer while ensuring the conductive performance of the first transparent electrode layer, thereby increasing the light transmittance of the organic electroluminescent device, and avoiding the problem of voltage drop due to poor conductivity of the first transparent electrode layer. Therefore, the method increases the display effect and use stability of the organic electroluminescent device.

The step S101 can be carried out using the following two manners.

Figure 3:
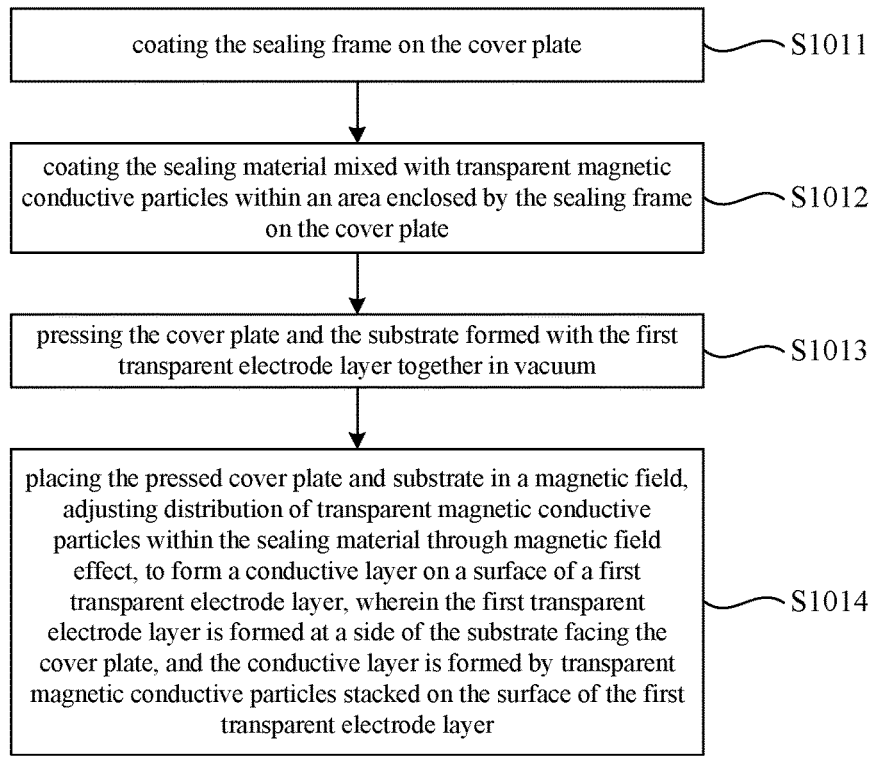
FIG. 3 is a flow chart of an implementation of step S101 in the method as shown in FIG. 2.
Figure 4:
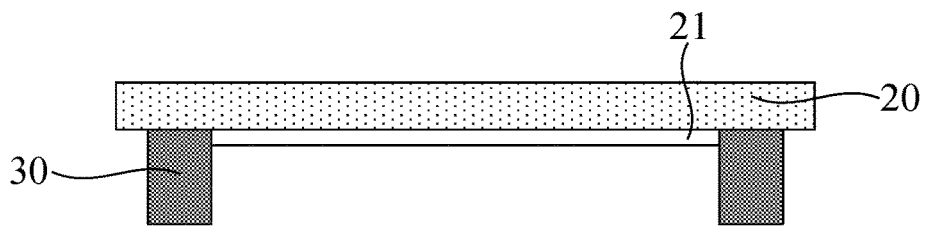
FIG. 4 is a structural schematic view of an organic electroluminescent device formed after coating a sealing frame on a cover plate.
Figure 5:
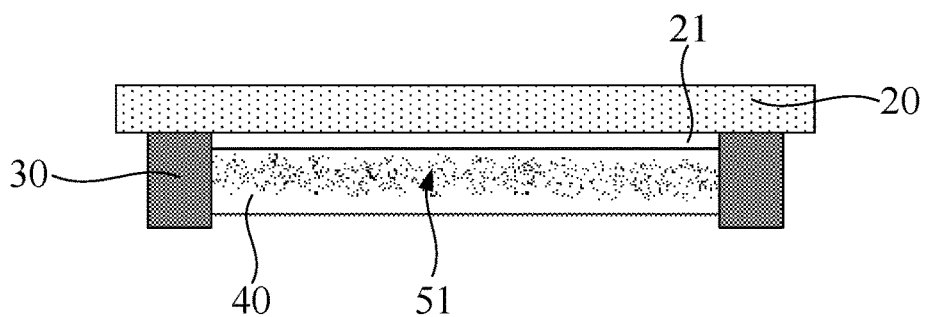
FIG. 5 is a structural schematic view of an organic electroluminescent device after a sealing layer is formed.
Figure 6:
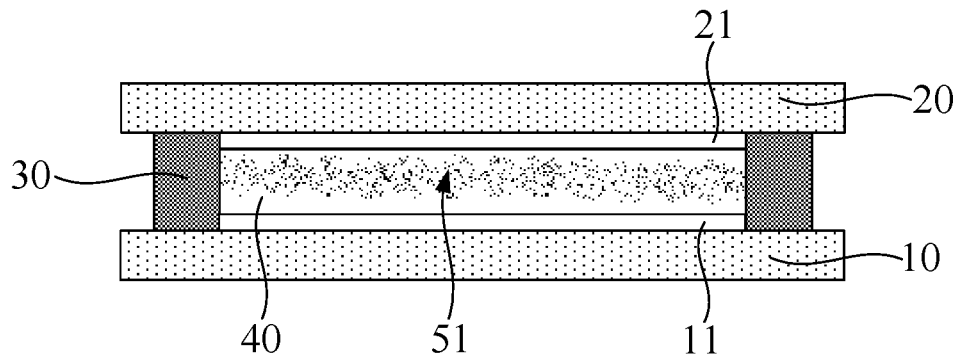
FIG. 6 is a structural schematic view of an organic electroluminescent device after pressing the cover plate and the substrate together.

In the first manner, as shown in FIG. 3, the step S101 comprises:

step S1011, as shown in FIG. 4, coating a sealing frame 30 on a cover plate 20;

step S1012, as shown in FIG. 5, coating the sealing material mixed with transparent magnetic conductive particles 51 within an area enclosed by the sealing frame 30 on the cover plate 20, to form a sealing layer 40;

step S1013, as shown in FIG. 6, pressing the cover plate 20 and the substrate 10 formed with the first transparent electrode layer 11 together in vacuum; and step S1014, placing the pressed cover plate 20 and substrate 10 as shown in FIG. 6 in a magnetic field, adjusting distribution of transparent magnetic conductive particles 51 within the sealing layer 40 through magnetic field effect, to form a conductive layer 50 formed by stack of transparent magnetic conductive particles 51 on a surface of the first transparent electrode layer 11 formed at a side of the substrate 10 facing the cover plate 20, so as to form an organic electroluminescent device as shown in FIG. 1.

In an embodiment, the sealing material is coated on the cover plate using gluing process, slot coating or ink jet coating.

Figure 7:
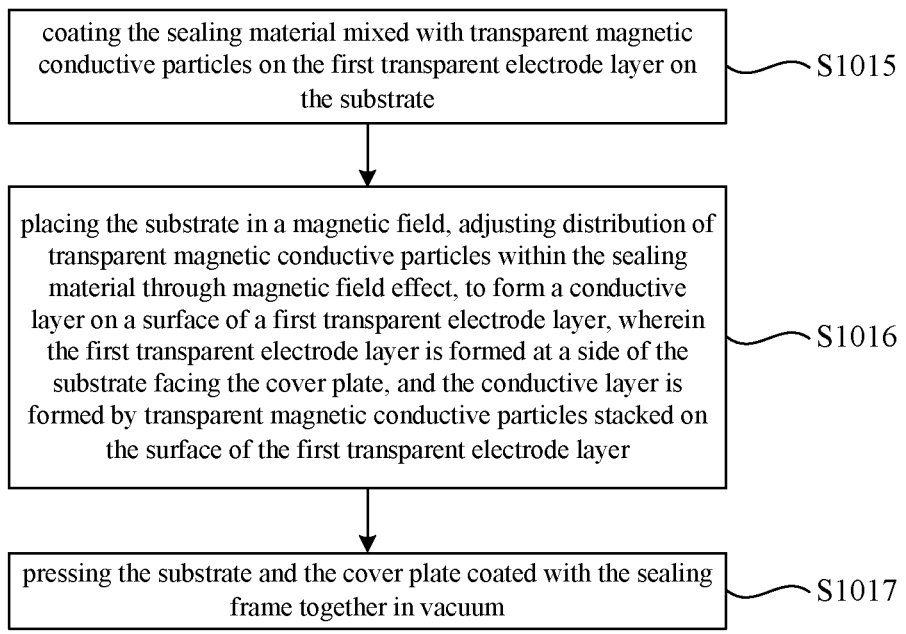
FIG. 7 is a flow chart of another implementation of step S101 in the method as shown in FIG. 2.
Figure 8:
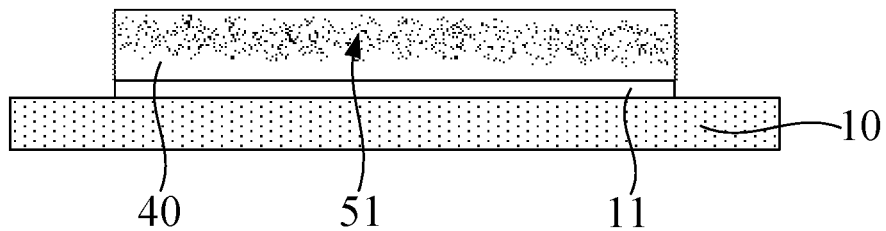
FIG. 8 is a structural schematic view of an organic electroluminescent device after forming a sealing layer on the substrate.
Figure 9:
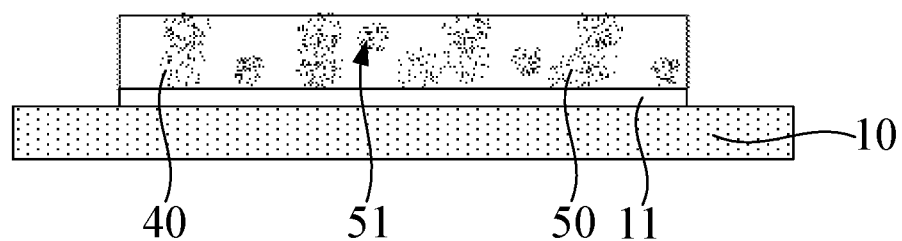
FIG. 9 is a structural schematic view of an organic electroluminescent device after a conductive layer is formed by placing the substrate in a magnetic field.

In the second manner, as shown in FIG. 7, the step S101 comprises:

step S1011, as shown in FIG. 8, coating the sealing material mixed with transparent magnetic conductive particles 51 on the first transparent electrode layer 11 on the substrate 10, so as to form a sealing layer 40;

step S1012, as shown in FIG. 9, placing the substrate 10 in a magnetic field, adjusting distribution of transparent magnetic conductive particles 51 within the sealing layer 40 through magnetic field effect, to form a conductive layer 50 formed by stack of transparent magnetic conductive particles 51 on a surface of the first transparent electrode layer 11 formed at a side of the substrate 10 facing the cover plate 20; and step S1013, pressing the substrate 10 and the cover plate 20 coated with the sealing frame 30 together in vacuum, to form an organic electroluminescent device as shown in FIG. 1.

In an embodiment, the sealing material is coated on the substrate using ink jet coating or slot coating.

In an example, the step S102 comprises:

curing the sealing frame and the sealing material by UV radiation or heating to assemble the substrate and the cover plate.

In an example, prior to the step S101, the method further comprises:

step S100, mixing transparent magnetic conductive particles in the sealing material.

In the mehtod shown in FIGS. 3 and 7, the sealing material is coated in a single step to form the sealing layer. In other embodiments, the sealing layer is formed by coating the sealing material in two or more steps. In an example, a sealing material which comprises transparent magnetic conductive particles is coated between the cover plate and the substrate, and a sealing material which does not comprises transparent magnetic conductive particles is coated on the sealing material. In another example, a sealing material comprising transparent magnetic conductive particles in a first weight concentration is coated between the cover plate and the substrate, and a sealing material comprising transparent magnetic conductive particles in a second weight concentration larger than the first weight concentration is coated on the sealing material.

Apparently, the skilled person in the art can make various modificaitons and variations to the present invention without departing from the spirit and the scope of the present invention. In this way, provided that these modifications and variations of the present invention belong to the scopes of the claims of the present invention and the equivalent technologies thereof, the present invention also intends to encompass these modifications and variations.

What is claimed is:

1. An organic electroluminescent device, comprising a substrate and a cover plate arranged opposite to each other, a sealing frame located between the substrate and the cover plate for connecting the substrate and the cover plate, a sealing layer filling an area enclosed by the sealing frame and bonded with the substrate and the cover plate, a first transparent electrode layer being provided at a side of the substrate facing the cover plate, wherein the organic electroluminescent device further comprises a conductive layer formed by transparent magnetic conductive particles which are mixed in the sealing layer and stacked on a surface of the first transparent electrode layer.

2. The organic electroluminescent device of claim 1, wherein the first transparent electrode layer comprises indium zinc oxide.

3. The organic electroluminescent device of claim 1, wherein a weight concentration of the transparent magnetic conductive particles in the sealing layer is greater than or equal to 5% and less than or equal to 50%.

4. The organic electroluminescent device of claim 3, wherein a diameter of the transparent magnetic conductive particles in the sealing layer is not greater than 200 nm.

5. The organic electroluminescent device of claim 1, wherein the transparent magnetic conductive particles are metal oxide nanoparticles or non-metal oxide nanoparticles.

6. The organic electroluminescent device of claim 1, wherein a second transparent electrode layer is formed on a surface of the cover plate facing the substrate, the sealing layer is provided with a conductor structure formed by transparent magnetic conductive particles mixed in the sealing layer, and the conductor structure joins the second transparent electrode layer with the first transparent electrode layer.

7. The organic electroluminescent device of claim 2, wherein a second transparent electrode layer is formed on a surface of the cover plate facing the substrate, the sealing layer is provided with a conductor structure formed by transparent magnetic conductive particles mixed in the sealing layer, and the conductor structure joins the second transparent electrode layer with the first transparent electrode layer.

8. The organic electroluminescent device of claim 3, wherein a second transparent electrode layer is formed on a surface of the cover plate facing the substrate, the sealing layer is provided with a conductor structure formed by transparent magnetic conductive particles mixed in the sealing layer, and the conductor structure joins the second transparent electrode layer with the first transparent electrode layer.

9. The organic electroluminescent device of claim 4, wherein a second transparent electrode layer is formed on a surface of the cover plate facing the substrate, the sealing layer is provided with a conductor structure formed by transparent magnetic conductive particles mixed in the sealing layer, and the conductor structure joins the second transparent electrode layer with the first transparent electrode layer.

10. The organic electroluminescent device of claim 5, wherein a second transparent electrode layer is formed on a surface of the cover plate facing the substrate, the sealing layer is provided with a conductor structure formed by transparent magnetic conductive particles mixed in the sealing layer, and the conductor structure joins the second transparent electrode layer with the first transparent electrode layer.

11. An organic electroluminescent device display panel, comprising an organic electroluminescent device of claim 1.

12. A method for preparing an organic electroluminescent device of claim 1, comprising:
    step S101, coating a sealing frame and a sealing material mixed with transparent magnetic conductive particles between a cover plate and a substrate, and adjusting distribution of transparent magnetic conductive particles within the sealing material through magnetic field effect, to form a conductive layer on a surface of a first transparent electrode layer, wherein the first transparent electrode layer is formed at a side of the substrate facing the cover plate, and the conductive layer is formed by transparent magnetic conductive particles stacked on the surface of the first transparent electrode layer;
    step S102, curing the sealing frame and the sealing material to assemble the substrate and the cover plate.

13. The method of claim 12, wherein the step S101 comprises:
    coating the sealing frame on the cover plate;
    coating the sealing material mixed with transparent magnetic conductive particles within an area enclosed by the sealing frame on the cover plate;
    pressing the cover plate and the substrate formed with the first transparent electrode layer together in vacuum; and
    placing the pressed cover plate and substrate in a magnetic field, adjusting distribution of transparent magnetic conductive particles within the sealing material through magnetic field effect, to form the conductive layer on the surface of a first transparent electrode layer, wherein the first transparent electrode layer is formed at a side of the substrate facing the cover plate, and the conductive layer is formed by transparent magnetic conductive particles stacked on the surface of the first transparent electrode layer.

14. The method of claim 12, wherein the sealing material is coated on the cover plate using gluing process, slot coating or ink jet coating.

15. The method of claim 12, wherein the step S101 comprises:
    coating the sealing material mixed with transparent magnetic conductive particles on the first transparent electrode layer on the substrate;
    placing the substrate in a magnetic field, adjusting distribution of transparent magnetic conductive particles within the sealing material through magnetic field effect, to form a conductive layer on a surface of a first transparent electrode layer, wherein the first transparent electrode layer is formed at a side of the substrate facing the cover plate, and the conductive layer is formed by transparent magnetic conductive particles stacked on the surface of the first transparent electrode layer; and
    pressing the substrate and the cover plate coated with the sealing frame together in vacuum.

16. The method of claim 14, wherein the sealing material is coated on the substrate using ink jet coating or slot coating.

17. The method of claim 12, wherein the step S102 comprises:
    curing the sealing frame and the sealing material by UV radiation or heating to assemble the substrate and the cover plate.

18. The method of claim 12, wherein prior to the step S101, the method further comprises: mixing transparent magnetic conductive particles in the sealing material.

19. The method of claim 12, wherein coating the sealing material between the cover plate and the substrate comprises:
    coating a sealing material which comprises transparent magnetic conductive particles between the cover plate and the substrate; and
    coating on the sealing material a sealing material which does not comprises transparent magnetic conductive particles.

20. The method of claim 12, wherein coating the sealing material between the cover plate and the substrate comprises:

coating a sealing material comprising transparent magnetic conductive particles in a first weight concentration between the cover plate and the substrate; and
coating on the sealing material a sealing material comprising transparent magnetic conductive particles in a second weight concentration larger than the first weight concentration.

\* \* \* \* \*